United States Patent
Chen et al.

(10) Patent No.: US 8,829,887 B2
(45) Date of Patent: Sep. 9, 2014

(54) PULSE TYPE LAYER-ID DETECTOR FOR 3D-IC AND METHOD OF THE SAME

(75) Inventors: Ming-Pin Chen, Qiaotou Township, Kaohsiung County (TW); Meng-Fan Chang, Taichung (TW); Wei-Cheng Wu, Hsinchu (TW)

(73) Assignee: National Tsing Hua University, Hsin Chu (TW)

( * ) Notice: Subject to any disclaimer, the term of this patent is extended or adjusted under 35 U.S.C. 154(b) by 1013 days.

(21) Appl. No.: 12/896,429

(22) Filed: Oct. 1, 2010

(65) Prior Publication Data
US 2011/0311018 A1 Dec. 22, 2011

(30) Foreign Application Priority Data
Jun. 22, 2010 (TW) ................................ 99120328 A

(51) Int. Cl.
*G01R 31/28* (2006.01)
(52) U.S. Cl.
USPC ...................................... 324/73.1; 324/76.11

(58) Field of Classification Search
USPC .................................. 324/73.1, 76.11; 377/47
See application file for complete search history.

(56) References Cited

U.S. PATENT DOCUMENTS

| | | | |
|---|---|---|---|
| 6,944,557 B2 * | 9/2005 | Hama et al. ..................... | 702/66 |
| 7,494,846 B2 | 2/2009 | Hsu et al. | |
| 8,564,305 B2 * | 10/2013 | Chen et al. .................... | 324/537 |
| 2007/0126105 A1 | 6/2007 | Yamada et al. | |

* cited by examiner

*Primary Examiner* — Quan Tra
(74) *Attorney, Agent, or Firm* — Muncy, Geissler, Olds & Lowe, P.C.

(57) ABSTRACT

A 3D-IC detector for each layer of a stacked device comprises a pulse generator to receive an initial signal and generate a pulse-in signal to a next stage detector. A latch is coupled to the pulse generator to receive an output signal from the pulse generator and generate a layer identifying signal. A counter is coupled to previous stage detector and the initial signal to perform a counting operation; and an adder coupled to the counter to add a number to a counting output from the counter and input added signal to the pulse generator.

21 Claims, 4 Drawing Sheets

PULSE TYPE LAYER-ID DETECTOR FOR 3D-IC AND METHOD OF THE SAME

FIELD OF THE INVENTION

The present invention generally relates to a 3D stacked chip device, and especially to a pulse type layer-ID detector for 3D-IC.

DESCRIPTION OF THE PRIOR ART

Recently, portable electronic equipment such as mobile telephones and non-volatile semiconductor memory media such as IC memory cards have been downsized, and there have been increasing demands for reducing the number of parts used in the equipment and media and downsizing thereof. Therefore, in the semiconductor industry, packaging technologies for integrated circuits (ICs) have been advancing to meet requirements for miniaturization and mounting reliability. For example, the requirement for miniaturization results in acceleration of technological development for a package having a similar size in relation to a semiconductor chip. Further, the requirement for mounting reliability places importance on packaging technologies that are capable of enhancing efficiency of a mounting process and improving mechanical and electrical reliability after the mounting process is completed. Thus, there have been considerable activities in the development of efficiently packaging a semiconductor chip. As packages that meet the demands, there are a chip scale package (CSP) having a package size substantially equal to that of the semiconductor chip, a multi-chip package (MCP) in which multiple semiconductor chips are incorporated into a single package, and a package-on-package (POP) in which multiple packages are stacked and combined into a single-piece member.

In pace with the development of technology, in response to an increase in storage capacity required for memory and the like, stacked type semiconductor devices (multichip devices) have been proposed which have semiconductor integrated circuit chips stacked together. Namely, there is provided a stacked type semiconductor device formed of at least two semiconductor integrated circuit devices stacked, each having a specification and including a semiconductor integrated circuit chip, wherein each of the semiconductor integrated circuit devices includes a conductor that penetrates the semiconductor integrated circuit device, and the semiconductor integrated circuit devices are electrically connected by the conductors and a value of the specification, excluding a size, of the uppermost semiconductor integrated circuit device or the lowermost semiconductor integrated circuit device is maximum or minimum. Consequently, the stacked type semiconductor device has a plurality of chips stacked in a vertical direction. In the stacked type semiconductor device, the chips are electrically connected together via, for example, through plugs that penetrate the chips. Thus, to select a desired one of the stacked memory chips of the same structure is an important task. If a stacked type semiconductor device is manufactured, chips may be individually subjected to operation tests so that only normal chips can be sorted out and stacked.

One of the technologies to offer vertical connection is called Through-Silicon-Via (TSV) which has emerged as a promising solution in 3-D stacked devices. It is a technology where vertical interconnects is formed through the wafer to enable communication among the stacked chips. One of the related articles may refer to IEEE, JOURNAL OF SOLID-STATE CIRCUITS, VOL. 45, NO. 1, JANUARY 2010, entitled: "8 Gb 3-D DDR3 DRAM Using Through-Silicon-Via Technology". In the article, a 3-D DRAM with TSVs is proposed which overcomes the limits of conventional module approaches. It also discloses how the architecture and data paths were designed. 3-D technologies including TSV connectivity check and repair scheme, and power noise reduction method are also disclosed. TSVs can be formed simply after fab-out so that no special process integration during the normal process flow is required. Chip identification (ID) is typically assigned.

After the same or different chips are stacked to form a three dimension chip, in order to select a desired chip among plural chip of 3D-IC device to operate, when the system operate, every chip of 3D-IC device have to be identified a layer-ID (layer identification number) to select the designated chip to operate. Many methods for identifying a layer-ID are proposed in the past, however, that is not only to increase the cost, but still not to overcome the problem that the more stacked chips of 3D-IC device, the more electrodes. For instance, ELPIDA MEMORY INC. disclosed a stacked type semiconductor memory device and chip selection circuit and the publication number is 20070126105. It provides a stacked type semiconductor memory device in which when selecting a desired semiconductor chip among a plurality of stacked semiconductor chips, a plurality of chip identification numbers different from each other can be automatically generated by a plurality of operation circuits connected in cascade, and the desired semiconductor chip can be reliably selected by a unique identification number assigned to each semiconductor chip using the semiconductor chips having the same structure without employing a complicated structure or particular control. In the prior art, a calculated output of an increment circuit of a last stage among M increment circuits connected in cascade may be used to determine the number M of the semiconductor chips. By this, when the number of stacked type semiconductor devices is unknown, the correct number of semiconductor chips can be reliably recognized. A further prior art U.S. Pat. No. 7,494,846 is disclosed by Taiwan Semiconductor Manufacturing Company, Ltd., filed on Mar. 9, 2007. It disclosed a semiconductor structure including a first semiconductor die and a second semiconductor die identical to the first semiconductor die. The first semiconductor die includes a first identification circuit; and a first plurality of input/output (I/O) pads on the surface of the first semiconductor die. The second semiconductor die includes a second identification circuit, wherein the first and the second identification circuits are programmed differently from each other; and a second plurality of I/O pads on the surface of the second semiconductor die. Each of the first plurality of I/O pads is vertically aligned to and connected to one of the respective second plurality of I/O pads. The second semiconductor die is vertically aligned to and bonded on the first semiconductor die.

The present invention provides a novel method for 3D-IC identify.

SUMMARY OF THE INVENTION

An aspect of the present invention is to provide a method and a scheme of 3D-IC detector for a stacked device.

A 3D-IC detector for each layer of a stacked device comprises a pulse generator to receive an initial signal and generate a pulse-in signal to a next stage detector. A latch is coupled to the pulse generator to receive an output signal from the pulse generator and generate a layer identifying signal. A counter is coupled to previous stage detector and the initial signal to perform a counting operation; and an adder is coupled to the counter to add a number to a counting output from the counter and input added signal to said pulse generator. The next stage detector and the previous stage detector are located at different layer of the stacked device.

The pulse generator includes pluralities of frequency dividers in series, pluralities of pulse circuits in which each of the pluralities of pulse circuits coupled to an output of current stage frequency dividers and input of next stage frequency dividers, pluralities of AND gates in which each of the pluralities of AND gates coupled to corresponding the pluralities of pulse circuits, and a OR gate coupled to the pluralities of AND gates.

The pulse circuit includes a delayer, an inverter coupled to the delayer and an AND gate coupled to the inverter.

Each one of the pluralities of frequency dividers is a dividing-2 divider; input signal frequency of a first frequency divider is twice of the one of a second frequency divider; input signal frequency of a first frequency divider is four times of the one of a third frequency divider; the input signal frequency of a first frequency divider is eight times of the one of a fourth frequency divider.

The input signal period of a first frequency divider is half of the one of a second frequency divider; the input signal period of a first frequency divider is one-fourth of the one of a third frequency divider; input signal period of a first frequency divider is one-eighth of the one of a fourth frequency divider.

DESCRIPTION OF THE PREFERRED EMBODIMENT

Figure 1:
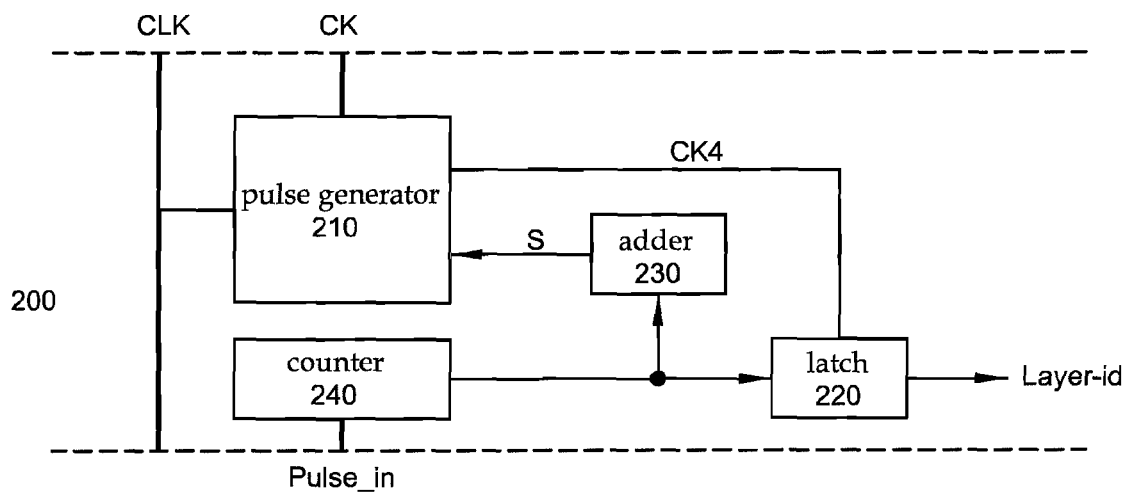
FIG. 1 shows an embodiment of the ID detector according to the present invention.

Some sample embodiments of the invention will now be described in greater detail. Nevertheless, it should be recognized that the present invention can be practiced in a wide range of other embodiments besides those explicitly described, and the scope of the present invention is expressly not limited expect as specified in the accompanying claims. A 3D-IC detector for each layer of a stacked device comprises a pulse generator to receive an initial signal and generate a pulse-in signal to a next stage detector. A latch is coupled to the pulse generator to receive an output signal from the pulse generator and generate a layer identifying signal. A counter is coupled to previous stage detector and the initial signal to perform a counting operation; and an adder coupled to the counter to add a number to a counting output from the counter and input added signal to the pulse generator.

The present invention generally relates to a 3D-IC, a 3D-IC device is typically formed by stacking a plurality of chips which can be the same or different type chips with each other (one another). The side-view of a 3D-IC device may refer to any structure of prior art. As shown in the prior art list above, the 3D-IC device are stacked with several layers over a main board of the lowermost layer and an interface chip is stacked thereon. Further, the first to uppermost layer of the 3D-IC device are denoted numbers in sequence. A plurality of solder balls is formed on the lower surface of the board, and the 3D-IC device can be electrically connected to an external device the outside through these solder balls. The interface chip controls the input/output of signals for the five-layer 3D-ICs devices. A plurality of bumps is formed on the top surface and the back surface of the 3D-IC device and on the back surface of the interface chip. The bumps are connected to each stacked chip of the 3D-IC device and be made by the Through-Silicon-Via (TSV) technology. It is a technology where vertical interconnections are formed through the wafer to enable communication among the stacked chips. The bumps are the electrical connection paths for each chips of the 3D-IC device. Furthermore, the signals of the five-layer devices are vertical connected through the bumps with each other. In this embodiment, the chips may have the same storage capacity and the same structure and can perform read/write operation by accessing each of them individually. In this embodiment of the present invention, every chip (or layer) of the 3D-IC device has a unique layer-ID number to distinguish from others. A designated chip could be selected from the stacked layers of the 3D-IC device by assigning a layer-ID number which is different from the one of other device with one another (each other). Each chip of the 3D-IC device is provided with a detector to perform the detecting operation by the layer-ID number, which is in addition to a memory circuit. Specific configuration and operation of the detector will be described as follows.

FIG. 1 illustrates the ID detector 200 for each layer. The ID detector 200 includes a pulse generator 210 in which a first terminal is coupled to a CLK signal, a second terminal outputs CK signal to next stage ID detector, a third terminal is coupled to a latch 220 to output a layer ID for this layer, and a forth terminal is coupled to an adder 230. The adder 230 will add one to the signal sent from a counter 240. The CLK signal is input into the pulse generator 210, and the counter 240 is coupled to the CLK signal to calculate the times of the CLK signals. Then, the signal is fed to the adder 230 to add one to the signal from the counter 240, followed by sending the calculation to the pulse generator 210, and thereby outputting the CK4 signal to the latch 220 for identifying the layer number.

Figure 2:
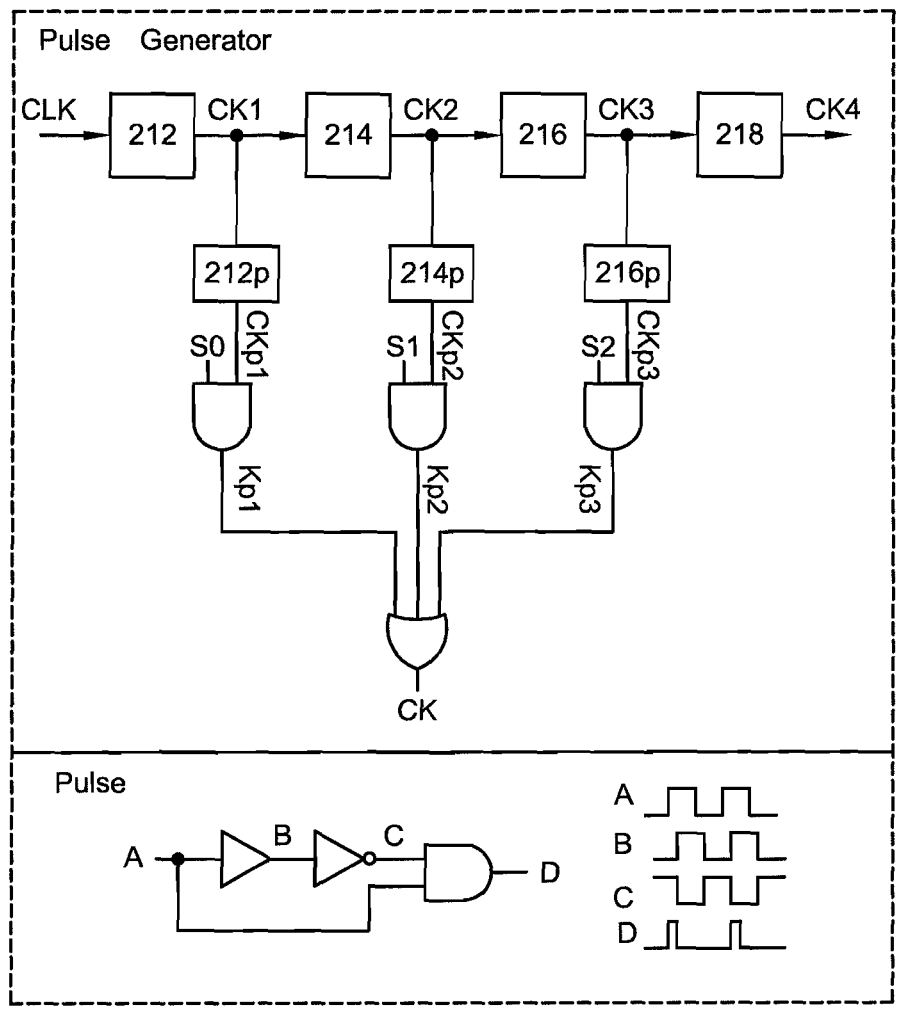
FIG. 2 shows an embodiment of the pulse generator according to the present invention.

FIG. 2 illustrates the pulse generator 210 which includes pluralities of frequency divider 212, the frequency divider 212 may output a divided frequency which is obtained via dividing the input frequency by an integer. In one preferred embodiment, the integer is 2 for example. The/2 in the block refer to the input frequency is divided by 2. The number of the frequency divider is dependent on the demand and required, and any number is possible. The input terminal of the first frequency divider 212 is coupled to a CLK signal, and the output of the first frequency divider 212 is coupled to the input of next, namely, the second frequency divider 214 and a first pulse circuit 212p. By the similar configuration, each output of previous frequency divider is coupled to the input of next frequency divider and a pulse circuit. Thus, the third frequency divider 216 and the second pulse circuit 214p are respectively coupled to the output of the second frequency divider 214. Similarly, the fourth frequency divider 218 and the third pulse circuit 216p are respectively coupled to the output of the third frequency divider 216. CLK signal is couple to the output of the fourth frequency divider 218.

The aforementioned pulse circuits including 212p, 214p, and 216p will output signal CKp1, CKp2, CKp3 to a corresponding AND gates, respectively. Then, signals S0, S1, S2 will input to another terminals of the corresponding AND gates, respectively. After the operation of these AND gates, output signals of these AND gates will send to an OR gate, following by outputting CK signal.

The CK value table may be referred to the right-hand side of FIG. 2, it indicates the output CK value based on the input signal from the AND gates and is determined by the OR gates. From the table, for instant, if the input signal of the OR gate from the AND gates is 000, the output of the OR gate will 0. When the CK is zero, then the ID number is 0. Take another example, if the input signal of the OR gate from the AND gates is 001, the output (CK) of the OR gate will Ckp3, and then the ID number is 1. It means only the third AND gates outputs signal which is determined by the OR gate, Kp3 which can be used as ID 1. Similarly, if the input signal of the OR gate from the AND gates is 011, the output (CK) of the OR gate will CKp2 and CKp3, it indicates that the second and the third AND gates output signals, Kp2 and Kp3, the output signal may be employed as layer identification 3. When the first, second and the third AND gates output signals is Kp1+Kp2+Kp3, it means the input of the OR gate is 111, the output signal (CK) of the OR gate will be CKp1+CKp2+CKp3 which may be used as layer identification 7. Other operation is similar to above method, the illustration is now omitted. Under the scheme, each layer may be identified by the method as set in the table from 0-7.

The bottom of the FIG. 2 illustrates the elements of the pulse circuit which includes a delayer and an inverter coupled in series. An AND gate is connected to the output of the inverter, and another terminal is coupled to the input of the delayer. Under such configuration, the input signal will be delay and inverted by the inverter, and thereby generating a pulse after the inverted signal passes through the AND gate.

Figure 3:
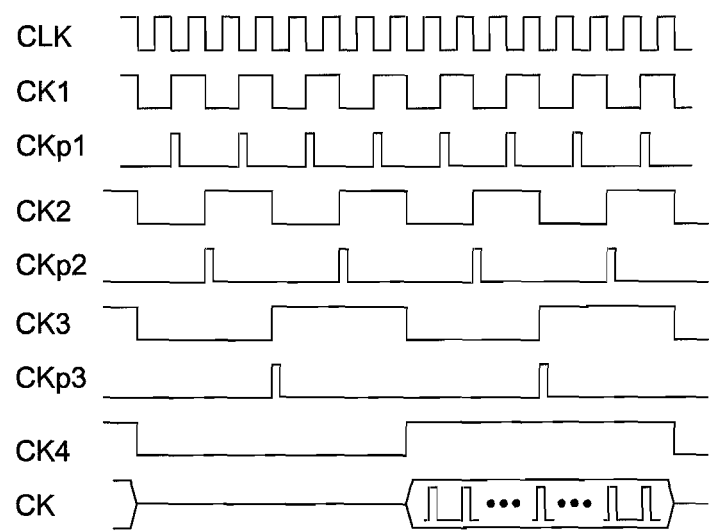
FIG. 3 shows the timing diagram of the signals of the present invention.

FIG. 3 illustrates the wave form timing diagram for each signal of FIG. 2. From the diagram, the period of CK1 is twice of the one of CLK due to the frequency of CLK is divided by the first frequency divider 212, therefore, the period is twice if the first frequency divider 212 is a dividing-by-2 (/2) divider. Based on the same reason, the period of the CK2, CK3 are four times and eight times of the initial signal CLK. The period of the CK4 is 16 times of the initial signal CLK. The corresponding pulse signals CKp1, CKp2 and CKp3 are also illustrates within the diagram. Not only the timings to generate the pulse signals CKp1, CKp2 and CKp3 are different, but also the period of them are different. The period of the CKp2 is twice of the one of CKp1, while the period of the CKp3 is twice of the one of CKp2. Thus, the pulse timing can be distinguished from one another.

If each one of the pluralities of frequency dividers is a dividing-by-2 (/2) divider, the input signal frequency of a first frequency divider is twice of the one of a second frequency divider; input signal frequency of a first frequency divider is four times of the one of a third frequency divider; similarly, the input signal frequency of a first frequency divider is eight times of the one of a fourth frequency divider. To phrase in another way, the input signal period of a first frequency divider is half of the one of a second frequency divider; the input signal period of a first frequency divider is one-fourth of the one of a third frequency divider; the input signal period of a first frequency divider is one-eighth of the one of a fourth frequency divider.

Figure 4:
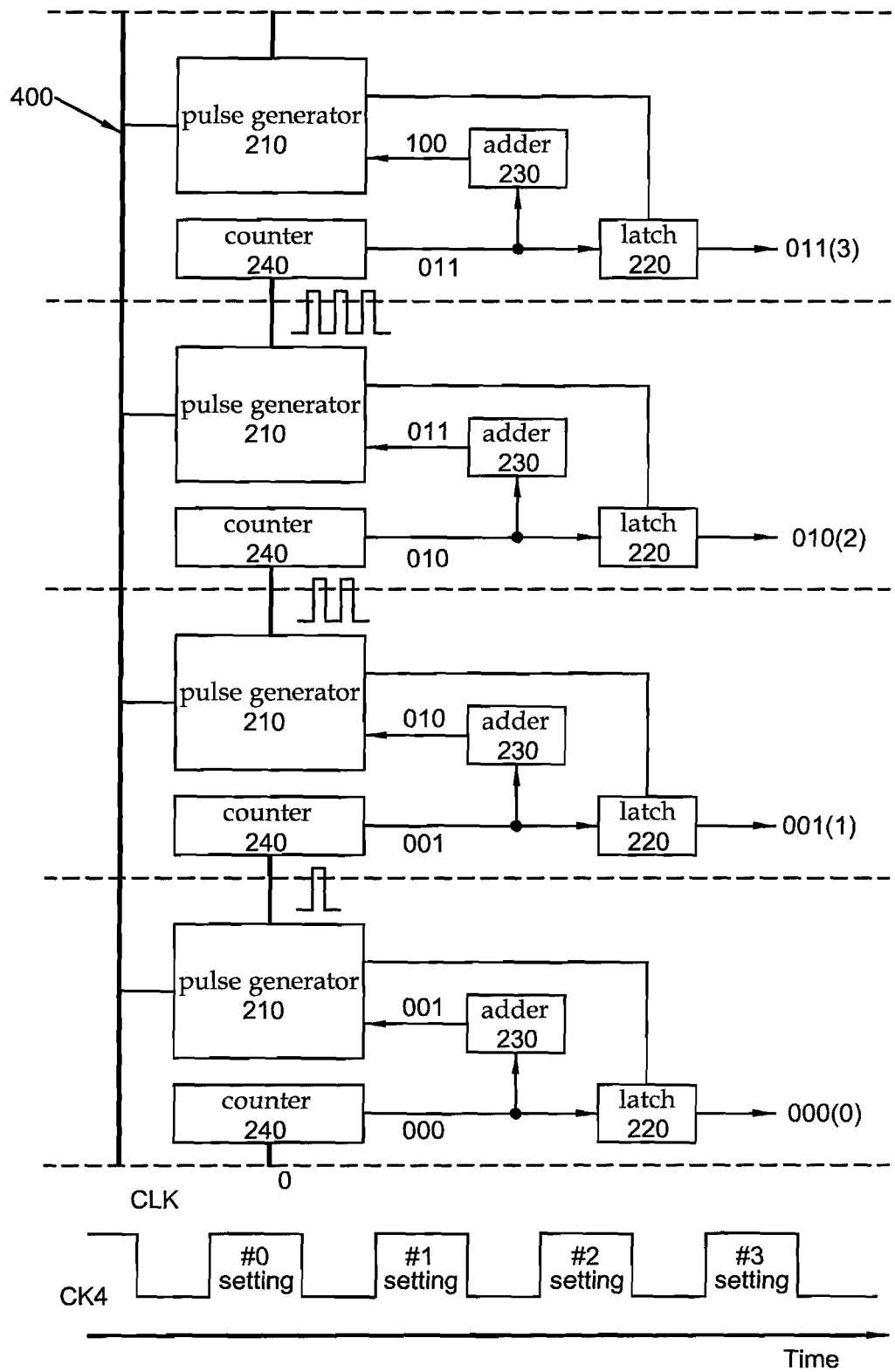
FIG. 4 shows the four-layer 3D-IC scheme of the present invention.

FIG. 4 is an example of four-layer stacked semiconductor device, each one has an ID detector 200 mentioned above and the operation scheme is the same with the aforementioned process. The current 3D-IC detector for each layer of a stacked device is located in one layer of the stacked device. It includes a pulse generator to receive an initial signal and generate a pulse-in signal to a next stage detector. The latch is coupled to the pulse generator to receive an output signal from the pulse generator and generate a layer identifying signal. A counter is coupled to the previous stage detector and the initial signal to perform a counting operation; and an adder is coupled to the counter to add a number to a counting output from the counter and input added signal to the pulse generator, wherein the current stage detector, the next stage detector and previous stage detector are located at different layer of the stacked device.

The output CK signal of previous stage will be employed as an input signal (pulse-in) of the counter of next stage detector. The CLK signal will couple to the input terminal of each pulse generator 210 of each layer of the stacked device through a communication bus line. The bus line could be done by TSV 400 (Through-Silicon-Via Technology). TSV offers vertical connection between the layers of the 3-D stacked devices. It is a technology where vertical interconnects is formed through the wafer to enable communication among the stacked chips. By the way, the connection between the counter of this stage detector and the pulse generator of the previous stage is formed by TSV. Similarly, the connection between the counter of the next stage detector and the pulse generator of this stage is formed by TSV. By using aforementioned scheme, each layer may be detected by its identification number, automatically. From the illustrations, each latch of each layer may output a digital status of 000, 001, 010, 011 to act as the layer ID for each layer of the stacked device. It refer to the first layer has an ID "zero", the second layer has an ID "one", and the ID of the third, and fourth layers are "two" and "three", respectively.

For the present approaches, the present invention provides a 3D-IC detector (or generator) to identify a layer-ID for each chip of 3D-IC device through the pulse generator and the adder, and followed by selecting a designated chip when the system operates.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

What is claimed is:

1. A 3D-IC detector for each layer of a stacked device, a current stage detector located in one layer of said stacked device, comprising:
   a pulse generator to receive an initial signal and generate a pulse-in signal to a next stage detector;
   a latch coupled to said pulse generator to receive an output signal from said pulse generator and generate a layer identifying signal;
   a counter coupled to previous stage detector and said initial signal to perform a counting operation; and
   an adder coupled to said counter to add a number to a counting output from said counter and input added signal to said pulse generator, wherein said current stage detector, said next stage detector and previous stage detector are located at different layer of said stacked device.

2. The 3D-IC detector according to claim 1, wherein each said pulse generator at said different layer of said stacked device is coupled to CLK signal by through silicon via.

3. The 3D-IC detector according to claim 1, wherein said pulse generator includes pluralities of frequency dividers in series, pluralities of pulse circuits in which each of said pluralities of pulse circuits coupled to an output of current stage frequency dividers and input of next stage frequency dividers, pluralities of AND gates in which each of said pluralities of AND gates coupled to corresponding said pluralities of pulse circuits, and a NOR gate coupled to said pluralities of AND gates.

4. The 3D-IC detector according to claim 3, wherein said pulse circuit includes a delayer, an inverter coupled to said delayer and a second AND gate coupled to said inverter.

5. The 3D-IC detector according to claim 3, wherein each said pluralities of frequency dividers is a dividing-by-2 divider.

6. The 3D-IC detector according to claim 5, wherein input signal frequency of a first frequency divider is twice of the one of a second frequency divider.

7. The 3D-IC detector according to claim 5, wherein input signal frequency of a first frequency divider is four times of the one of a third frequency divider.

8. The 3D-IC detector according to claim 5, wherein input signal frequency of a first frequency divider is eight times of the one of a fourth frequency divider.

9. The 3D-IC detector according to claim 5, wherein input signal period of a first frequency divider is half of the one of a second frequency divider.

10. The 3D-IC detector according to claim 5, wherein input signal period of a first frequency divider is one-fourth of the one of a third frequency divider.

11. The 3D-IC detector according to claim 5, wherein input signal period of a first frequency divider is one-eighth of the one of a fourth frequency divider.

12. A 3D-IC detector for each layer of a stacked device, a current stage detector located in one layer of said stacked device, comprising:
a pulse generator to receive an initial signal and generate a pulse-in signal to a next stage detector; wherein said pulse generator includes pluralities of frequency dividers in series, pluralities of pulse circuits in which each of said pluralities of pulse circuits coupled to an output of current stage frequency dividers and input of next stage frequency dividers, pluralities of AND gates in which each of said pluralities of AND gates coupled to corresponding said pluralities of pulse circuits, and a NOR gate coupled to said pluralities of AND gates;
a latch coupled to said pulse generator to receive an output signal from said pulse generator and generate a layer identifying signal;
a counter coupled to previous stage detector and said initial signal to perform a counting operation;
an adder coupled to said counter to add a number to a counting output from said counter and input added signal to said pulse generator; wherein said current stage detector, said next stage detector and previous stage detector are located at different layer of said stacked device.

13. The 3D-IC detector according to claim 12, wherein each said pulse generator at said different layer of said stacked device is coupled to CLK signal by through silicon via.

14. The 3D-IC detector according to claim 12, wherein said pulse circuit includes a delayer, an inverter coupled to said delayer and a second AND gate coupled to said inverter.

15. The 3D-IC detector according to claim 12, wherein each said pluralities of frequency dividers is a dividing-by-2 divider.

16. The 3D-IC detector according to claim 15, wherein input signal frequency of a first frequency divider is twice of the one of a second frequency divider.

17. The 3D-IC detector according to claim 15, wherein input signal frequency of a first frequency divider is four times of the one of a third frequency divider.

18. The 3D-IC detector according to claim 15, wherein input signal frequency of a first frequency divider is eight times of the one of a fourth frequency divider.

19. The 3D-IC detector according to claim 15, wherein input signal period of a first frequency divider is half of the one of a second frequency divider.

20. The 3D-IC detector according to claim 15, wherein input signal period of a first frequency divider is one-fourth of the one of a third frequency divider.

21. The 3D-IC detector according to claim 15, wherein input signal period of a first frequency divider is one-eighth of the one of a fourth frequency divider.

* * * * *